United States Patent [19]

Sakurai

[11] 4,353,085
[45] Oct. 5, 1982

[54] INTEGRATED SEMICONDUCTOR DEVICE HAVING INSULATED GATE FIELD EFFECT TRANSISTORS WITH A BURIED INSULATING FILM

[75] Inventor: Junji Sakurai, Tokyo, Japan

[73] Assignee: Fujitsu Limited, Kawasaki, Japan

[21] Appl. No.: 15,427

[22] Filed: Feb. 26, 1979

[30] Foreign Application Priority Data

Feb. 27, 1978 [JP] Japan .................................. 53-21912
Jun. 29, 1978 [JP] Japan .................................. 53-78931
Nov. 13, 1978 [JP] Japan .................................. 53-138805

[51] Int. Cl.³ .................... H01L 27/02; H01L 29/06; H01L 29/04
[52] U.S. Cl. ...................................... 357/42; 357/41; 357/56; 357/59
[58] Field of Search ................... 357/41, 55, 56, 59, 357/42

[56] References Cited

U.S. PATENT DOCUMENTS 4,041,518 8/1977 Shimizu et al. .................... 357/59
4,219,836 8/1980 McElroy ............................ 357/41
4,251,828 2/1981 Sakurai ............................. 357/56

OTHER PUBLICATIONS

*RCA COS/MOS Integrated Circuits Manual,* RCA Corp., Somerville, N.J. (3/71) pp. 24–26.

Primary Examiner—Gene M. Munson
Attorney, Agent, or Firm—Staas & Halsey

[57] ABSTRACT

An integrated semiconductor device having a plurality of IG FETs respectively formed an epitaxial semiconductor layer in plural apertures of a buried insulating film, and having regions for wiring extending under the buried insulating film within the semiconductor substrate. The wiring area has conductivity type opposite to the semiconductor substrate and functions to electrically connect between plural IG FETs. Thereby more complicated wirings can be realized. This region lying under the buried insulating film in the substrate can also function as the common well in the complementary type integrated semiconductor device and can eliminate the problem of defective operation which is likely to be caused in a complementary device having the buried insulating film.

16 Claims, 15 Drawing Figures

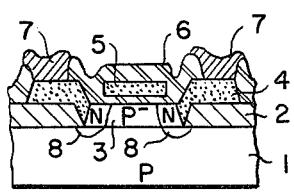
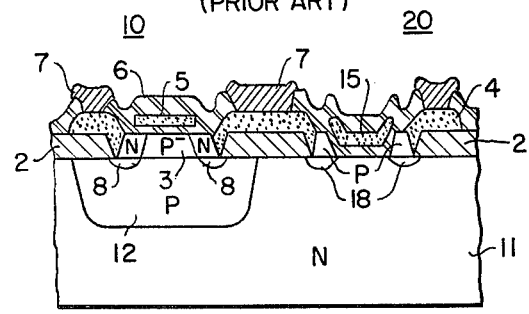
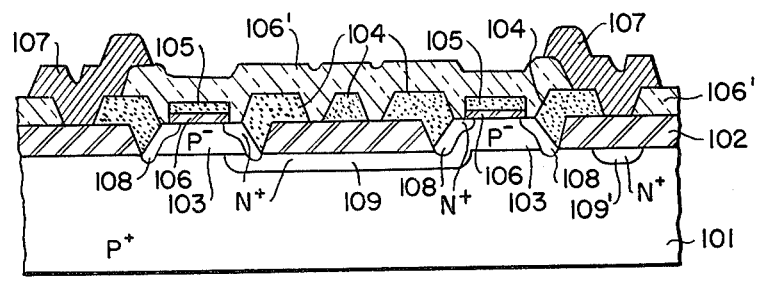
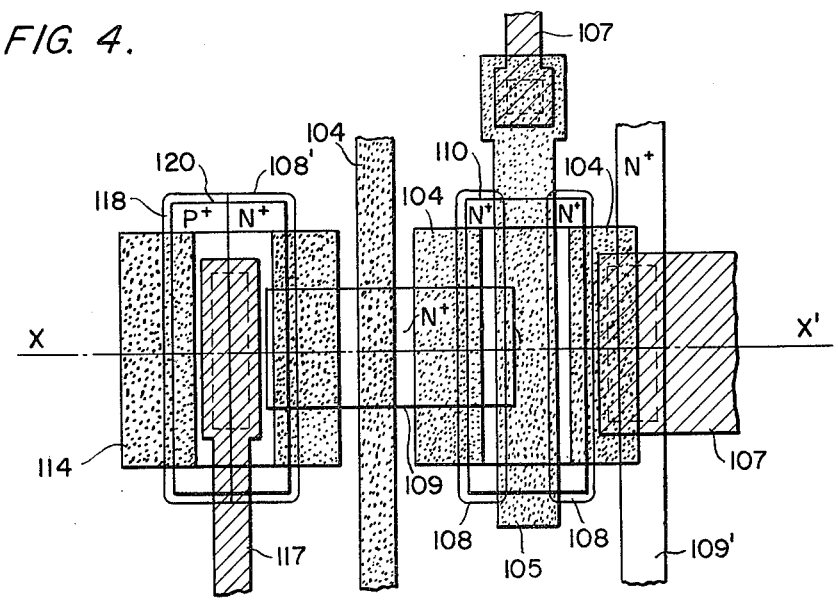
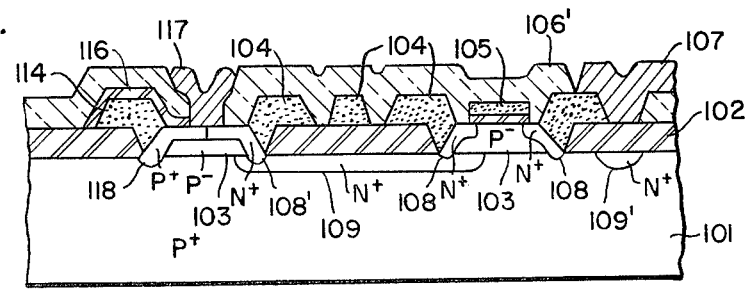

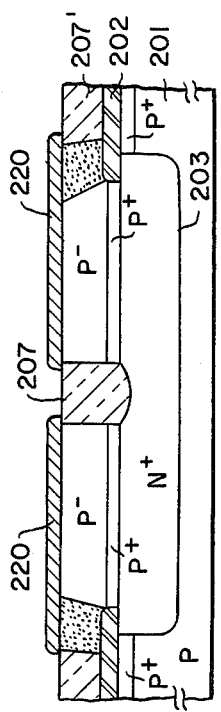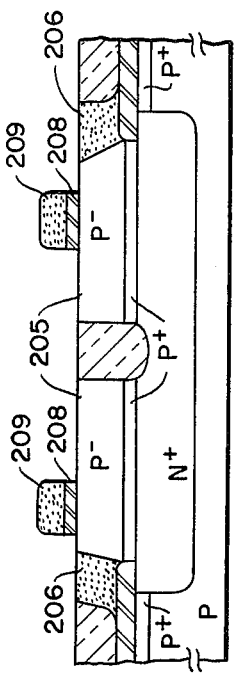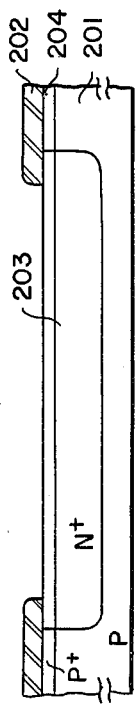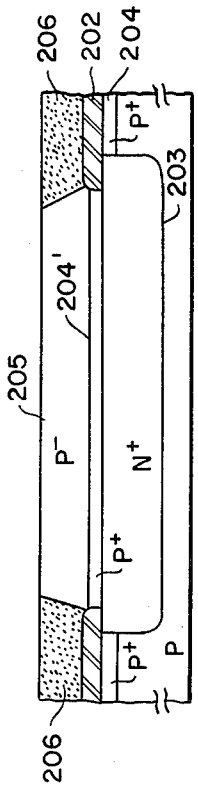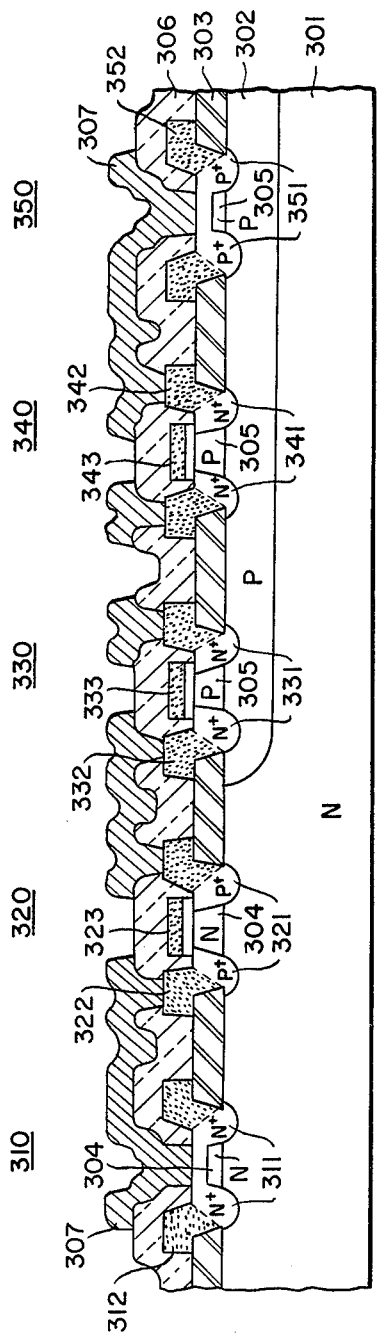

INTEGRATED SEMICONDUCTOR DEVICE HAVING INSULATED GATE FIELD EFFECT TRANSISTORS WITH A BURIED INSULATING FILM

BACKGROUND OF THE INVENTION

1. Field of the Invention

This invention relates to an integrated circuit having insulated gate field effect transistors (IGFET) which is well known in general as a MOS-IC.

2. Description of the Prior Art

In an integrated circuit which comprises an IGFET as the principal element, improvement in the operating speed and integration density is greatly requested. In order to improve such operation speed, it is an effective means to reduce the parasitic junction capacitance incorporated in to the source or drain regions of the IGFET, and the reduction of this parasitic junction capacitance is attained by reducing an area of the pn junction formed around the source or drain region, or by setting the impurity concentration at the area near the pn junction to lower levels. Elimination of an area having high impurity concentration near to this pn junction is desired also for avoiding reduction of the break down voltage at the junction area. On the other hand, for the improvement of integration density, it is necessary not only to make each IGFET small in size but also to reduce the area occupied by the wiring pattern by increasing the degree of freedom of the wirings.

As the means for reducing junction capacitance, the so-called SOS configuration is well known, wherein a silicon layer for the active layer is formed by epitaxial growth on a sapphire substrate. However, the SOS type device basically has such inevitable disadvantages as deterioration of the crystalline characteristic of the active layer related to the hetero-epitaxial configuration and the high cost of the sapphire substrate. A device having no such disadvantages and reduced junction capacitance is indicated in "A New Isolation Structure for High Density LSI", by S. Iwamatsu et al., IEDM Technical Digest, 1973, page 244-247. A device indicated in this material has comparatively high impurity concentration as shown in FIG. 1, wherein the cross section is indicated. This device characteristically comprises the semiconductor substrate 1, the buried insulating film 2 which is formed on the substrate and has an aperture, the epitaxial layer 3 which is formed at the aperture with low impurity concentration and the silicon layer 4 which is formed through growth together with the epitaxial layer 3 and shows a polycrystal characteristic on the insulating film 2. The IGFET is composed of the gate electrode 5 formed on the epitaxial layer 3, the insulating film 6, the metallic layer 7 for electrodes or wiring and the source or drain region 8 which is formed within the epitaxial layer 3 with a high impurity concentration of the opposite conductivity type. This IGFET has the advantage that the area of the pn junction formed along the circumference of the source and drain region 8 is significantly smaller than that of the prior art IG FETS. This reduces the above-mentioned parasitic capacitance. On the other hand, in the integrated circuit having plural IG FETs, the wirings are established by conductive layers on the wiring layers as in the case of existing ICs and therefore it is requested to improve the degree of freedom of the wirings.

As taught in the abovementioned reference, the device shown in FIG. 2 adapts the IG FET shown in FIG. 1 to the complementary type integrated circuits. In FIG. 2, the IG FET 10 of the n channel type has the same structure as that of FIG. 1 and the same portions of FIG. 1 are given the same numbering. The substrate 11 has comparatively high N type impurity concentration and is covered with the p channel type IG FET 20 having the p type regions 18 for the source of and drain and gate electrode 15. The n channel type IG FET 10 is formed on the p type region (p type well) 12 having a comparatively high impurity concentration. Since the p type well 12 is formed by introducing the p type impurity through the aperture of the buried insulating film 2, it can be provided independently for an aperture of a n channel IG FET. Thus, the p type epitaxial layer 3 and p type well 12 are electrically floating and they are so small in size that when a small amount of charge is injected therein the potential is easily changed thereby. When the potential of the epitaxial layer 3 and p type well 12 changes, the gate threshold voltage of the IG FET 10 provided thereon also changes due to the well known back gate effect, often resulting defective-operation. Moreover, since an electrode which is in contact with the epitaxial layer 3 or the p type well 12 cannot be provided in the IG FET shown in FIG. 2, it is impossible to give a specified back gate bias to the p type epitaxial layer or to the p type well 12 in accordance with the circuit configuration and the requirements of operation. Thus, strongly hoped for is the advent of a novel complementary integrated circuit having of plural IG FETs and including a buried insulating film in which the above mentioned disadvantages are eliminated.

SUMMARY OF THE INVENTION

It is an object of the present invention to offer an integrated circuit which utilizes an IG FET as the principal element and has improved operating speed and integration density.

It is another object of the present invention to offer an integrated circuit having plural IG FETs and a buried insulating film with a reduced parasitic capacitance.

It is an other object of the present invention to offer a novel means for preventing unwanted variation of threshold voltage due to the back gate effect in a complementary integrated circuit to which the IG FET having a buried insulating film is adapted.

It is a further object of the present invention to offer a means for giving the specifed back gate effect in accordance with the requirement of the circuit configuration in a complementary integrated circuit to which the IG FET having a buried insulating film is adapted.

It is a further object of the invention to increase the degree of freedom of the wiring between different elements of the integrated circuit using plural IG FETs.

An integrated semiconductor device of the present invention is formed on a semiconductor substrate as in the case of a device by the prior art and also has a buried insulating film having plural apertures and a semiconductor layer covering this insulating film and apertures. Typically, the substrate and semiconductor layer are composed of silicon, while the insulating film is composed of silicon dioxide. The semiconductor layer comprises an epitaxial layer of single crystal in the apertures and a polycrystal layer on the insulating film. On the epitaxial layer within each aperture, typically, the active element which is an insulated gate field effect transistor is formed. It is one of the notable characteristics of the device related to the present invention that an area having opposite conductivity type to the substrate and electrically connects plural regions respectively forming plural active elements is provided within the substrate under the abovementioned insulating film. According to an embodiment, the region having opposite conductivity type provided under said insulating film within the substrate is extended up to the source or drain region of one IG FET from that of another IG FET and connects electrically these regions. This structure enables two-level crossing with the wiring layer provided on the surface of the device and thereby improves the degree of freedom of the wirings and as a result improves integration density of the device. According to the other embodiment of the present invention, the common well regions having the opposite conductivity type to the substrate are formed in the substrate and on the substrate the buried insulating film exposing these common well regions are formed. Within the epitaxial layer formed in the aperture of the buried insulating film located on the common well region, the IG FET operating by the opposite conductivity type channel to that formed on the substrate area is formed, and thereby a complementary type integrated semiconductor device is realized. In this structure, since a plural IG FETs are formed on the common well, a common well area sufficiently larger than that of the prior art can be obtained, namely the common well can have sufficiently large junction capacitance. For this reason, even if a very little amount of charge is injected to the common well region, a comparatively large variation of potential does not occur, which is different from the prior art. Therefore, defective operation due to an unwanted back gate effect can be effectively eliminated in this embodiment.

In any embodiment, a wiring layer is capable of making contact with the region having opposite conductivity type to the substrate which is provided within the substrate, or to the common well region through one of the apertures of the buried insulating film in which no active element is formed. In order to obtain ohmic contact with the wiring layer, it is desirable to provide a region of an opposite conductivity type to the substrate or of the same conductivity type as the common well region having high impurity concentration in the epitaxial layer of this aperture. To the common well region, a predetermined bias potential, namely the back gate bias can be supplied from this wiring layer.

Further features and advantages of the present invention will be apparent from the following description with reference to the accompanying drawings to which, however, the scope of the invention is in no way limited.

BRIEF DESCRIPTION OF THE DRAWINGS

FIG. 1 shows a cross-section of a semiconductor device having the buried insulating film related to the prior art.

FIG. 2 shows a partial cross-section of a complementary type integrated semiconductor device having the buried insulating film related to the prior art.

FIG. 3 shows a cross-section of an integrated semiconductor device related to an embodiment of the present invention.

FIG. 4 shows a plane view of a part of the device related to an embodiment of the present invention.

FIGS. 5A through 5E show a cross-section of the device shown in FIG. 4 and that of the substrate in the course of the manufacturing process.

FIGS. 6A through 6E show a partial cross-section of an integrated semiconductor device related to another embodiment of the present invention and that of the substrate in the course of the manufacturing process.

FIG. 7 shows a partial cross-section of a complementary type integrated semiconductor device related to another embodiment of the present invention.

DESCRIPTION OF PREFERRED EMBODIMENTS

Figure 5B:
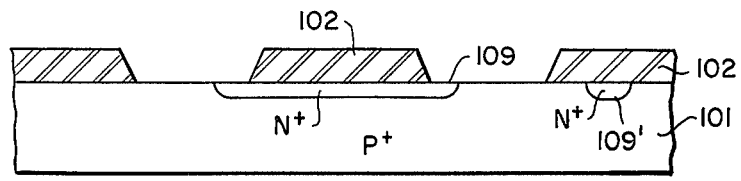
Figure 5C:
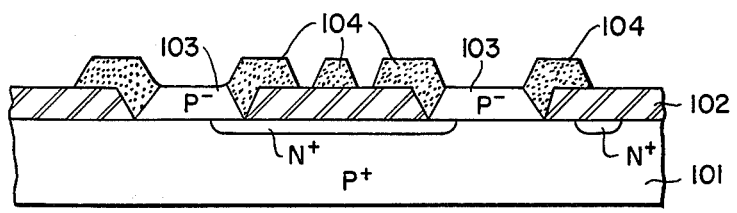
Figure 5D:
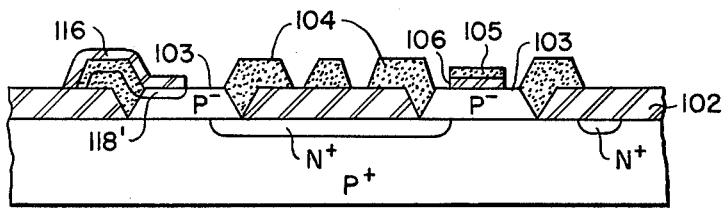
Figure 5E:
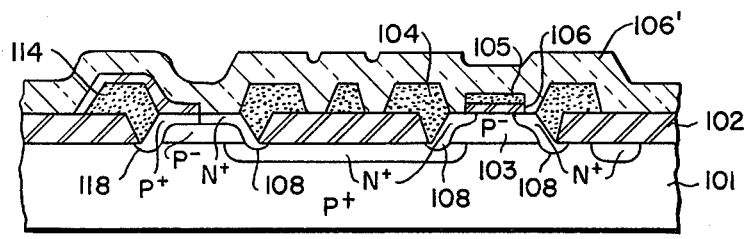

An embodiment of the integrated semiconductor device related to the present invention will be explained by referring to FIG. 3.

In a part of the device shown in FIG. 3, the buried insulating film 102 which is composed of silicon dioxide and provides a plurality of apertures is formed on the P+ type silicon substrate 101 having high impurity concentration. On the surface of the silicon substrate 101 exposed within each aperture of the buried insulating film 102, the single crystal silicon epitaxial layer 103 is formed. This silicon layer is originally P− type having low impurity concentration and it is extended up into the area over the buried insulating film 102 where it has a polycrystal nature. In the epitaxial layer 103 within each aperture, the n channel type IG FET is formed. Each IG FET has the gate electrode 105 of polycrystal silicon and the gate insulating film 106 on the epitaxial layer 103. The n+ type source and drain regions 108 having high impurity concentration are provided in the epitaxial layer 103, adjacent to the buried insulating film 102. The n type impurity is introduced in high concentration as in the case of the source and drain regions into the polycrystal silicon layer 104 and 105, and these function as the electrode and wiring layer. On the substrate, the insulating film 106' covering the silicon layers 103, 104, 105 is provided and the aluminum electrode 107 which covers the electrode windows formed in this insulating film 106' is also formed. According to a feature of the present invention, the n+ type region 109 having high impurity concentration is provided in the p+ silicon substrate 101. The n+ type region 109 is arranged under the buried insulating film 102, and it is extended from the source or drain region 108 of the one IG FET to that of the other IG FET. Thus, the n+ type region 109 electrically connects the source or drain regions of plural IG FETs. The other n+ type region 109' has the function to electrically connect between other IG FETs. Since these n+ type regions 109 and 109' can be arranged to spatially cross with the wiring layer 104 of polycrystal silicon or the aluminum wiring layer 107 arranged on the buried insulating film 102, more complicated mutual connections between many IG FETs become possible. Namely, the degree of freedom the wirings is drastically improved. It will bring about saving in the space for arranging the wiring layers, and result in an improvement in integration density.

The above advantage will be understood more easily by referring to the plane view shown in FIG. 4. FIG. 4 shows a partial plane view of another integrated semiconductor device basically having the same structure as the device shown in FIG. 3. FIG. 5 A shows the cross-section of the device shown in FIG. 4 along the X—X' line. In FIG. 4 and FIGS. 5A through 5E, the same element is given the same numbering as that in FIG. 3. The IG FET having the same structure as that shown in FIG. 3 is formed within the aperture 110 of the buried insulating film 102. On the other hand, in the other aperture 120 formed on the insulating film 102, a structure for electrically connecting the aluminum wiring layer 117 to the n+ type region 109 is formed. Namely, in the epitaxial layer 103 in the aperture 120, the n+ type region 108' and p+ type region 118 having high impurity concentration which enable ohmic contact of the aluminum electrode 117 are provided, and the aluminum electrode 117 is formed in close contact with the surface of both regions 108' and 118. The p+ region 118 has the function to electrically connect the p+ type substrate and aluminum electrode 117, and it is required for giving the well known back gate bias. In the case of a device shown in FIG. 4 and FIG. 5 A, the back gate bias given to the IG FET in the aperture 110 is of course zero because the source region 108 is connected to the electrode 117 via the n+ region 109 in the same potential as that of the p+ substrate. The polycrystal silicon layer 114 on the buried insulating film 102 adjacent to the p+ region 118 shows the p+ conductivity type and the insulating film 116 provided at the surface is used as the mask for masking the n type impurity for forming the source and drain regions 108, 108' in the manufacturing process. From FIG. 4 and FIG. 5 A, it can be understood that the n+ regions 109 and 109' arranged under the buried insulating film 102 in the substrate 101 enables more complicated mutual connections.

Manufacture of the device shown in FIG. 5 A is attained by the processes explained in relation to FIGS. 5 B to E.

First of all, with reference to FIG. 5 B, the n+ type regions 109 and 109' are formed, by the well known selective diffusion technique, in the p type (100) silicon substrate 101 having resistivity of 0.5 to 1.0 ohm-cm. Typically, the n+ type regions 109 and 109' are about 2 μm in depth and have surface resistance of 40 ohms-cm or less. Thereafter, the silicon dioxide film 102 in the thickness of about 1 μm is coated over the entire surface of the substrate for the buried insulating film, and thereafter the apertures are formed by applying well known photo-lithography.

Then with reference to FIG. 5 C, the silicon layer having the thickness of 1 μm is grown on the substrate covering the silicon dioxide film 102 and its apertures, thereby the p type single crystal epitaxial layer 103 having resistivity of 5 to 10 ohm-cm is formed on the surface of silicon substrate 101 which is exposed within the apertures of the silicon dioxide film 102, while the polycrystal layer 104 is formed on the silicon dioxide film 102. Then, the silicon layer is selectively removed, except for the portion to be used for configuring the active element, namely the IG FET, and the portion to be used for wirings, by applying photo-lithography to the silicon layer. The unwanted region of the silicon layer may be converted to the silicon dioxide layer by means of the well known selective thermal oxidation technique. Thus, isolation of the adjacent elements can be performed.

Then, with reference to FIG. 5 D, the surface of silicon layers 103 and 104 is slightly thermally oxidized and a thin silicon dioxide gate insulation film is formed. Thereafter, a mask such as a photo-resist layer is formed on the substrate covering the silicon layers 103 and 104, except for the portion wherein the p+ type region is to be formed in the succeeding process and then boron ion are implanted in the concentration of about $5 \times 10^{15}$ cm$^{-2}$. Thereby the p type region 118' is formed. Then, after removing the implantation masking layer, the polycrystal silicon layer in the thickness of about 5000 Å is deposited on the thin silicon dioxide film, and patterning of the polycrystal silicon layer and thin silicon dioxide film is performed by photo-lithography. As a result, the polycrystal silicon and the gate insulating film 106 comprising the silicon dioxide film are formed. On the other hand, the thin silicon dioxide film 116 remains on the surface of the p+ type region and this is used as the mask for masking the n type impurity in the process wherein the n type impurity is introduced into the region where the source and drain regions are to be formed.

With reference to FIG. 5 E, the phospho-silicate glass layer 106' in the thickness of about 8000 Å is deposited by the well known chemical vapor deposition technique on the entire part of the substrate, and the phosphorus contained in the glass layer 106' is diffused by the thermal treatment. The conditions of thermal treatment are adjusted so that depth of diffusion into the silicon epitaxial layer 103 becomes about 0.4 μm, and in the polycrystal silicon layers 104 and 105 the phosphorus which is the n type impurity is diffused until it reaches the buried insulating film 102 or gate insulating film 106 because of a high diffusion speed therein. Thus, the n type impurity is injected in a high concentration into the entire part of the polycrystal silicon layers 104 and 105, and simultaneously the n+ region 108 configuring the source or drain region is formed in the epitaxial layer 103. Moreover, during this thermal treatment, the boron which is the p type impurity in the p+ type region 118' is diffused, and thereby the entire part of the polycrystal silicon layer 114 becomes p+ type, and the p+ type region 118 is formed in the epitaxial layer 103.

Thereafter, the electrode window is formed in the phospho-silicate glass 106', aluminum is deposited in the thickness of 1 μm, and then a device shown in FIG. 5 A is completed by patterning this aluminum layer.

Figure 6A:
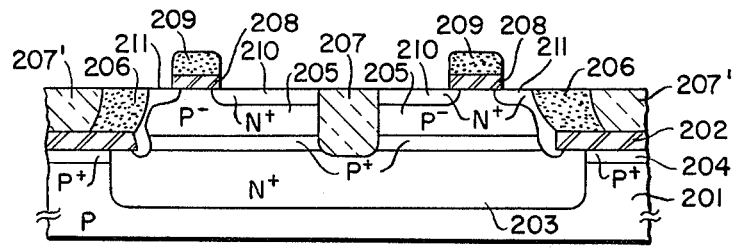

FIG. 6 A shows a partial cross-section of the integrated semiconductor device related to an other embodiment of the present invention. The device indicated herein has the following feature that the polycrystal silicon layer adjacent to one of the source and drain regions of the IG FET is omitted and instead a shallow source or drain region which does not come into contact with the area having higher impurity concentration is provided, in addition to the features of a device related to the previous embodiment. The merit resulting from such features will become more apparent from the description related to FIGS. 6 A through 6 E.

With reference to FIG. 6 A, on the p type silicon substrate 201, the buried insulating film 202 of silicon dioxide is formed, and in the silicon substrate 201, the n+ type region 203 and the p+ type region 204 under the buried insulating film 202 are provided.

Within the apertures of the buried insulating film 202, the silicon epitaxial layer 205 is provided in contact with the silicon substrate 201, while on the buried insulating film 202, the polycrystal silicon layer 206 extending from the epitaxial layer 205 is provided. The epitaxial layer 205 located in the aperture of the insulating film 202 is completely divided into two portions by the insulating film 207. Namely, the insulating film 207 defines two apertures in cooperation with the buried insulating film 202 and the epitaxial layer 205 is respectively arranged independently in each aperture. The insulating film 207' adjacent to the polycrystal silicon layer 206 has a function for isolation between adjacent elements. On the epitaxial layer 205, the gate insulating film 208 and gate electrode 209 are provided, and in the epitaxial layer 205, the n+ type regions 210 and 211 for the source and drain regions are formed, thereby one IG FET is respectively formed in each aperture. The n+ region 210 for one of the source and drain regions is a shallow area surrounded entirely by the epitaxial layer 205 having low impurity concentration, while the n+ region 211 for the other of the source and drain regions is formed in such a depth as reaching the silicon substrate 201 due to the quick impurity diffusion phenomenon in the polycrystal silicon layer 206 which will be described later. As a result of it, the n+ region 203 in the silicon substrate 201 is extended from the one to the other of the n+ regions 211, electrically connecting both regions 211. Since this n+ type region 203 can be arranged in the electrically isolated condition even under the region 210 for the one of the source and drain regions, more complicated wiring can be realized. In addition, the n+ region 210 for the one of the source and drain regions is not adjacent to the p type region having high impurity concentration and therefore it has a high breakdown voltage characteristic of pn junction and a small parasitic junction capacitance. In FIG. 6 A, the insulating film covering the surface and the aluminum wiring layer are omitted, but these may be provided as in the case of the previous embodiment.

The processes for manufacturing the device shown in FIG. 6 A will be explained with reference to FIG. 6 B to FIG. 6 E. In FIG. 6 B, then n+ type region 203 is formed in the specified position in the p type silicon substrate 201 by introducing arsenic or antimony in a high concentration by the well known selective diffusion techniques. On the other hand, the boron is injected into the entire surface of the silicon substrate 201 by the ion implantation technique and thereby the area 204 having the surface concentration of boron of $10^{17}$ to $10^{18}$ cm$^{-2}$ is formed. Thereafter, the silicon dioxide film 202 is formed by thermal oxidization on the entire surface of the substrate 201 and then an aperture is formed by photo-lithography.

With reference to FIG. 6 C, the silicon is subject to the gas phase growth treatment so that the epitaxial growth is generated, and thereby the epitaxial layer 205 consisting of single crystal silicon is formed on the surface of the silicon substrate which is exposed within the aperture of the silicon dioxide film 202, while the polycrystal silicon layer 206 is formed on the silicon dioxide film 202. When heated during the epitaxial growth, the boron in the p+ region 204 creeps upward and the p+ region 204' is formed at the bottom of the epitaxial layer 205. Moreover, at the epitaxial layer 205, the boron is doped, showing p− type, by the out diffusion of the boron in the p+ region 204. The p+ region 204 formed on the surface of the silicon substrate under the silicon dioxide film 202 functions as the well known channel stopper which blocks the inversion channel which is likely to be induced under the insulating film at the semiconductor surface having low impurity concentration.

With reference to FIG. 6 D, the oxidation mask film 220 such as a silicon nitride film is coated on the silicon layers 205 and 206, and then the silicon nitride film is selectively removed on the area for isolation of elements by means of photo-lithography. Thereafter, the silicon layers 205 and 206 of the area not covered with the silicon nitride film 220 are selectively oxidized by the thermal treatment for the substrate. By this treatment, the silicon dioxide film 207 having such a depth as reaching the n+ region in the silicon substrate 201 and the silicon dioxide film 207' reaching the buried oxide film 202 are formed.

With reference to FIG. 6 E, after the silicon nitride film 220 is completely removed, silicon dioxide and polycrystal silicon are sequentially coated and then photo-lithography is applied thereto. Thus, the gate oxide film 208 and silicon gate electrode 209 are formed. Next, the source and drain regions 210 and 211 shown in FIG. 6 A are formed by executing a diffusion treatment of an n type impurity such as arsenic or phosphorus to the substrate. In this impurity diffusion process, since the diffusion coefficient of impurity in the polycrystal silicon is as large as about 10 times of that in the single crystal silicon, the polycrystal silicon layer 206 is quickly saturated with the n type impurity and thereafter the n type impurity is diffused into the epitaxial layer 205 which is adjacent to the polycrystal layer 206. Therefore, the n+ type region 211 is formed in such a depth as reaching the n+ region 203 along the polycrystal silicon layer 206 within the epitaxial layer 205. On the other hand, the n+ region 210 which is not adjacent to the polycrystal silicon layer 206 is shallow and is surrounded completely by the p− type epitaxial layer 205. The n+ region extending under the epitaxial layer 205 and insulating films 202, 207 in the silicon substrate 201 may function for example, to commonly connect plural source regions in the completed device.

According to the present invention, the region having opposite conductivity type to the substrate provided therein under the buried insulating film can function not only as the wiring layer as shown in the embodiments mentioned above but also as the common well in the complementary type integrated semiconductor device. FIG. 7 shows a cross-section of a part of the complementary type device to which the present invention is adapted. The substrate 301 is composed of n type silicon having a specific resistance of 1 ohm-cm. In this substrate 301, the common p type well 302 is provided for disposing the n channel type IG FET thereon. The p type well 302 is 2 μm in depth and has the sheet resistivity of 0.5 ohm/square. The insulating film 303 formed on the substrate provides plural apertures exposing the p type region 302 and those exposing the n type region of the substrate. This insulating film 303 is composed of, for example, a silicon dioxide film of 1 μm thickness. The silicon layer is provided so as to extend over the insulating film 303 and cover each aperture. This silicon layer is composed of the epitaxial layers 304, 305 in each aperture and the polycrystal silicon layer extending over the insulating film 303 from this epitaxial layer. On each aperture of the insulating film 303, the contact element 310 to the n type region of the substrate, the p channel IG FET 320, the n channel IG FETs 330, 340, and the contact element 350 to the p well are formed respectively. The contact elements 310, 350 respectively have the contact regions 311, 351 having high impurity concentration which are formed in the epitaxial layers 304, 305 in such a depth as reaching the substrate. The polycrystal silicon layer 312, 352 extending from the contact regions 311, 351 over the insulating film 303 have no particular function in this embodiment. The aluminum electrode 307 comes into contact with the surface of the contact regions 311 and 351 through the electrode windows formed in the insulating film 306 covering the substrate, such as of phosphorus silicate glass. The ohmic contact of the aluminum electrode 307 to the contact regions 311, 351 is attained by the high impurity concentration of the contact regions 311, 351. The n+ contact region 311 is formed simultaneously with the n+ type source and drain regions 331, 341 of the n channel IG FET, and for example, it has the depth of 0.4 μm and the sheet resistivity of 18 to 20 ohms/square. The p+ contact region 351 is also formed simultaneously with the p+ source and drain region 321 of the p channel IG FET and may have the depth and resistivity similar to those mentioned above. Each IG FET has the polycrystal silicon regions 322, 332, 342 having the same high impurity concentration as that of the corresponding source and drain regions, adjacent to the source and drain regions 321, 331, 341. These polycrystal silicon layers 322, 332, 342 have the functions for electrically connecting the source and drain regions 321, 331 341 and the aluminum wiring layer 307, and the aluminum wiring layer 307 comes contact with the surface of the polycrystal silicon layers 322, 332 342 via the electrode window formed in the insulating film 306. The gate electrodes 323, 333, 343 of each IG FET is composed, for example, of polycrystal silicon having a thickness of 5000 Å, and the gate insulating film disposed between the gate electrode and epitaxial layers 304, 305 is composed, for example, of silicon dioxide film in the thickness of about 1000 Å.

One of the features of a complementary type integrated semiconductor device shown in FIG. 7 is that the epitaxial layer 305 having the function as the base region of the n channel IG FET is disposed in contact with the common p well 302 which has a large area. For this the potential variation occurring even when a small amount of charge is injected into the base region 305 is so small as can be ignored. This means that defective operation is less likely to occur due to an unexpected back gate effect. Moreover, a specified potential can be applied to the common p well 302 with the contact element 350. In this case, a specified back gate bias can be given to each n channel IG FET. Electrical connection of the wiring 307 to the n type region of substrate 301 is attained by means of the contact element 310, and a desired back gate gias for the p channel IG FET 320 can be applied via this contact element 310.

For the manufacture of the device shown in FIG. 7, it is essential to form the common p well 302 within the n type silicon substrate, prior to the formation of the buried insulating film 303. The epitaxial layers 304, 305 each of which contain the same impurity as that included in the underlying region of the substrate are formed simultaneously by depositing undoped silicon on the substrate so as to cause epitaxial growth, after the formation of the buried insulating film 303. The successive processes may essentially be the same as those for the previously mentioned embodiment, but it should be noted that n type impurity introduction and p type impurity introduction are performed sequentially in order to form the source and drain regions having two kinds of conductivity type.

What is claimed is:

1. An integrated semiconductor device comprising
   a semiconductor substrate of a first conductivity type,
   an insulating film formed on said substrate, said insulating film comprising a plurality of apertures each exposing a part of the surface of said substrate,
   a semiconductor layer formed selectively on said insulating film and on said exposed parts of said surface of said substrate, said semiconductor layer comprising an epitaxial layer where in contact with the exposed parts of said substrate and a polycrystal layer on said insulating film, said polycrystal layer comprising wiring portions,
   a plurality of active elements formed in said epitaxial layer within selected ones of said apertures, each of said elements comprising at least a first region of a second conductivity type opposite to said first conductivity type, and
   a second region of said second conductivity type formed in said substrate under said insulating film, said second region extending so as to selectively cross said wiring portions of said polycrystal layer so as to electrically connect said first regions of at least two of said active elements.

2. An integrated semiconductor device according to claim 1, selected ones of said active elements comprising an insulated gate field effect transistor.

3. An integrated semiconductor device according to claim 1, selected ones of said active elements each comprising within said epitaxial layer a third region of said first conductivity type to form a pn junction with said first region of the same active element.

4. The device of claim 3, selected ones of said active elements within corresponding ones of said apertures comprising two of said first regions of said second conductivity type.

5. The device of claim 3, at least selected ones of said third regions comprising a relatively low conductivity of said first conductivity type compared to the conductivity of said substrate.

6. The device of claim 3, selected ones of said first regions of said second conductivity type not being adjacent to any portion of said polycrystal layer.

7. An integrated semiconductor device comprising
   a semiconductor substrate of a first conductivity type,
   an insulating film formed on said substrate, said insulating film comprising a plurality of apertures each of which exposes a part of the surface of said substrate,
   a semiconductor layer formed selectively on said insulating film and on said exposed parts of said surface of said substrate, said semiconductor layer comprising an epitaxial layer on said exposed parts of said substrate and a polycrystal layer on said insulating film, said polycrystal layer comprising wiring portions,
   a plurality of insulated gate field effect transistors formed in said epitaxial layer within selected ones of said apertures, each of said transistors having source and drain regions of a second conductivity type opposite to said first conductivity type, said source and drain regions being adjacent to said insulating film, and
   a first region of said second conductivity type formed in said substrate under at least a portion of said insulating film so as to selectively cross said wiring portions of said polycrystal layer, said first region extending to electrically connect selected ones of said source and drain regions of said transistors.

8. An integrated semiconductor device according to claim 7 comprising means for electrically connecting at least one of said source and drain regions of selected ones of said transistors to said polycrystal layer on said insulating layer.

9. An integrated semiconductor device comprising
   a semiconductor substrate of a first conductivity type,
   an insulating film formed on said substrate, said insulating film comprising a plurality of apertures each of which exposes a part of the surface of said substrate, a semiconductor layer formed selectively on said insulating film and on said parts of said surface of said substrate, said semiconductor layer comprising an epitaxial layer on said substrate and a polycrystal layer on said insulating film, at least one insulated gate field effect transistor having source and drain regions of a second conductivity type opposite to said first conductivity type formed in said epitaxial layer within respective one(s) of said apertures, a first region of said second conductivity type formed selectively in said substrate under said insulating film, said first region extending selectively from at least one of said source and drain regions in at least one of said apertures to a position in said substrate adjacent to at least one other of said apertures, a metal wiring layer extending selectively over said semiconductor layer, and means for electrically connecting said metal wiring layer to said first region through at least one of said apertures, said means comprising a second region of said second conductivity type formed in said epitaxial layer within the respective one(s) of said apertures, said second region extending to said first region and forming an ohmic contact with said metal wiring layer.

10. The device of claim 7 or 9, portions of said epitaxial layer corresponding to selected ones of said transistors each comprising a region of relatively low conductivity of said first type compared to the conductivity of said substrate.

11. An integrated semiconductor device comprising a semiconductor substrate of a first conductivity type, an insulating film formed on said substrate, said insulating film having a plurality of apertures each of which exposes a part of the surface of said substrate, a semiconductor layer selectively formed on said insulating film and said parts of said surface of said substrate, said semiconductor layer comprising an epitaxial layer within each of said apertures and a polycrystal layer on said insulating film, a plurality of insulated gate field effect transistors, each of said transistors having source and drain regions of a second conductivity type opposite to said first conductivity type within selected ones of said apertures, selected ones of said source and drain regions extending to said polycrystal layer on said insulating film, and other selected ones of said source and drain regions terminating within said epitaxial layer, and a first region of said second conductivity type formed selectively in said substrate under said insulating film, said first region extending to electrically connect selected ones of said source and drain regions of said transistors not terminating within said epitaxial layer.

12. The device of claim 11, comprising at least one channel stopper comprising at least one region of said substrate having said first conductivity type beneath portions of said insulating film for isolation between selected ones of said transistors.

13. The device of claim 11, said source and drain regions terminating within said epitaxial layer not being adjacent to said polycrystal layer and to said source and drain regions extending to said polycrystal layer.

14. The device of claim 11, the portions of said epitaxial layer surrounding each of said source and drain regions terminating within said epitaxial layer having a conductivity of said first type that is relatively lower than the conductivity of said second type of said source and drain regions extending to said polycrystal layer and of said first region.

15. An integrated semiconductor device comprising a semiconductor substrate comprising a first region of a first conductivity type and a second region of a second conductivity type opposite to said first conductivity type, an insulating film selectively formed on said substrate, said insulating film having a plurality of first and second apertures, each of said first apertures exposing a part of said first region, and each of said second apertures exposing a part of said second region, a semiconductor layer selectively formed on said insulating film and said first apertures, said semiconductor layer comprising an epitaxial layer within each of said first apertures and a polycrystal layer on said insulating layer, and said epitaxial layer comprising third regions of said first conductivity type within selected ones of said first apertures, a plurality of first insulated gate field effect transistors selectively formed in said first apertures, each said transistor being formed to have source and drain regions of said second conductivity type adjacent to a respective one of said third regions, and a plurality of second insulated gate field effect transistors, each of said second transistors being formed in one of said second apertures with source and drain regions of said first conductivity type, and said first region electrically connecting selected ones of said third regions in said first apertures.

16. An integrated semiconductor device according to claim 15 comprising at least one metal wiring layer selectively extending over said semiconductor layer and means for electrically connecting said metal wiring layer to said first region through at least one of said first apertures, said means comprising a fourth region of said first conductivity type formed in said epitaxial layer within the respective one(s) of said first apertures, each said fourth region extending to said first region forming an ohmic contact with said metal wiring layer.

* * * * *

UNITED STATES PATENT AND TRADEMARK OFFICE
CERTIFICATE OF CORRECTION

PATENT NO. : 4,353,085
DATED : 8 Oct. 1982
INVENTOR(S) : JUNJI SAKURAI

It is certified that error appears in the above-identified patent and that said Letters Patent is hereby corrected as shown below:

Front page, [57] ABSTRACT, line 2, after "formed" insert --in--.

Column 1, line 19, "in to" should be --into--.

Column 2, line 31, delete "of";

line 33, "above mentioned" should be --above-mentioned--.

Column 3, line 5, "abovementioned" should be --above-mentioned--.

Column 6, line 12, "region" should be --regions--;

line 40, "an other" should be --another--.

Column 9, line 32, after "this" insert --reason,--;

line 42, "gias" should be --bias--.

Column 11, line 42-50 are not properly lined up with rest of indented material.

Signed and Sealed this

Eighth Day of March 1983

[SEAL]

Attest:

GERALD J. MOSSINGHOFF

Attesting Officer       Commissioner of Patents and Trademarks